United States Patent [19]
Thong

[11] Patent Number: 5,739,807
[45] Date of Patent: Apr. 14, 1998

[54] METHOD FOR PRESENTING COMPLEX NUMBER WAVEFORMS

[75] Inventor: Tran Thong, Beaverton, Oreg.

[73] Assignee: Tektronix, Inc., Beaverton, Oreg.

[21] Appl. No.: 759,346

[22] Filed: Sep. 13, 1991

[51] Int. Cl.$^6$ ........................................... G09G 5/36
[52] U.S. Cl. ........................................ 345/134; 345/147
[58] Field of Search ........................... 340/701, 703, 340/721, 728; 324/121 R, 88, 77 C, 77 B; 358/10; 345/134, 135, 136, 147, 150

[56] References Cited

U.S. PATENT DOCUMENTS

| | | | |
|---|---|---|---|
| 3,958,269 | 5/1976 | Davis | 358/10 |
| 4,464,656 | 8/1984 | NaKamura | 345/134 |
| 4,760,331 | 7/1988 | Komuro et al. | 324/121 R |
| 4,940,931 | 7/1990 | Katayana | 324/121 R |
| 4,995,006 | 2/1991 | Huenemann et al. | 324/77 B |
| 5,065,147 | 11/1991 | Rice et al. | 324/121 R |

*Primary Examiner*—Chanh Nguyen
*Attorney, Agent, or Firm*—Francis I. Gray

[57] ABSTRACT

A method is provided for displaying complex waveforms, where one of amplitude or phase is graphed versus time and the color or grayness of the curve, or the area under the curve, represents the other of amplitude or phase at the time of the first measurement.

11 Claims, 6 Drawing Sheets

| BINARY INPUT | BPSK OUTPUT PHASE |
|---|---|
| 0 | 180° |
| 1 | 0° |
Fig. 2
| n | PHASE (°) | AMP (V) |
|---|---|---|
| 0 | 0 | 1.0 |
| 1 | 0 | . |
| 2 | 0 | . |
| ... | ... | . |
| 23 | 0 | . |
| 24 | 180 | . |
| ... | ... | . |
| 47 | 180 | . |
| 48 | 0 | . |
| ... | ... | . |
| 71 | 0 | . |
| 72 | 0 | . |
| ... | ... | . |
| 95 | 0 | 1.0 |
Fig. 3
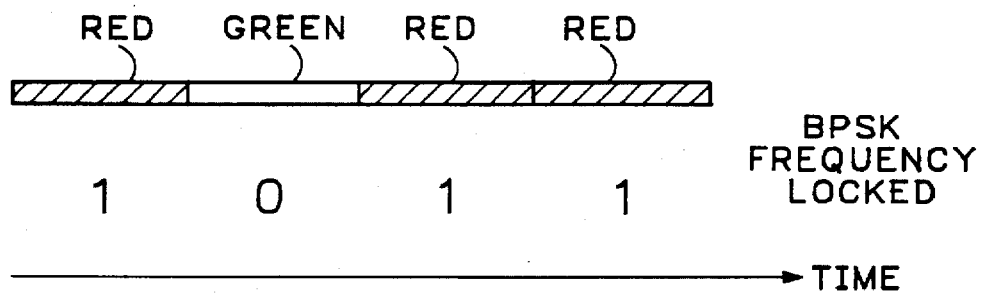
Fig. 4A
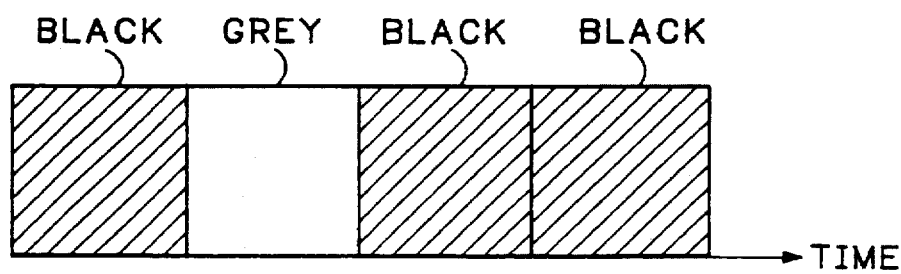
Fig. 4B

| BINARY INPUT | 8QAM OUTPUT AMPLITUDE | PHASE |
|---|---|---|
| 0 0 0 | 0.765V | −135° |
| 0 0 1 | 1.848V | −135° |
| 0 1 0 | 0.765V | −45° |
| 0 1 1 | 1.848V | −45° |
| 1 0 0 | 0.765V | +135° |
| 1 0 1 | 1.848V | +135° |
| 1 1 0 | 0.765V | +45° |
| 1 1 1 | 1.848V | +45° |

| TIME | AMPL | PHASE |
|---|---|---|
| 0 | 0.765 | -135 |
| 1 | 0.765 | -135 |
| 2 | 0.765 | -135 |
| 3 | 0.765 | -135 |
| 4 | 0.765 | -135 |
| 5 | 0.765 | -135 |
| 6 | 0.765 | -135 |
| 7 | 0.765 | -135 |
| 8 | 0.765 | -135 |
| 9 | 0.765 | -135 |
| 10 | 1.848 | -135 |
| 11 | 1.848 | -135 |
| 12 | 1.848 | -135 |
| 13 | 1.848 | -135 |
| 14 | 1.848 | -135 |
| 15 | 1.848 | -135 |
| 16 | 1.848 | -135 |
| 17 | 1.848 | -135 |
| 18 | 1.848 | -135 |
| 19 | 1.848 | -135 |
| 20 | 0.765 | 135 |
| 21 | 0.765 | 135 |
| 22 | 0.765 | 135 |

| TIME | AMPL | PHASE |
|---|---|---|
| 23 | 0.765 | 135 |
| 24 | 0.765 | 135 |
| 25 | 0.765 | 135 |
| 26 | 0.765 | 135 |
| 27 | 0.765 | 135 |
| 28 | 0.765 | 135 |
| 29 | 0.765 | 135 |
| 30 | 0.765 | 45 |
| 31 | 0.765 | 45 |
| 32 | 0.765 | 45 |
| 33 | 0.765 | 45 |
| 34 | 0.765 | 45 |
| 35 | 0.765 | 45 |
| 36 | 0.765 | 45 |
| 37 | 0.765 | 45 |
| 38 | 0.765 | 45 |
| 39 | 0.765 | 45 |
| 40 | 1.848 | -45 |
| 41 | 1.848 | -45 |
| 42 | 1.848 | -45 |
| 43 | 1.848 | -45 |
| 44 | 1.848 | -45 |
| 45 | 1.848 | -45 |

| TIME | AMPL | PHASE |
|---|---|---|
| 46 | 1.848 | -45 |
| 47 | 1.848 | -45 |
| 48 | 1.848 | -45 |
| 49 | 1.848 | -45 |
| 50 | 0.765 | -45 |
| 51 | 0.765 | -45 |
| 52 | 0.765 | -45 |
| 53 | 0.765 | -45 |
| 54 | 0.765 | -45 |
| 55 | 0.765 | -45 |
| 56 | 0.765 | -45 |
| 57 | 0.765 | -45 |
| 58 | 0.765 | -45 |
| 59 | 0.765 | -45 |
| 60 | 1.848 | 135 |
| 61 | 1.848 | 135 |
| 62 | 1.848 | 135 |
| 63 | 1.848 | 135 |
| 64 | 1.848 | 135 |
| 65 | 1.848 | 135 |
| 66 | 1.848 | 135 |
| 67 | 1.848 | 135 |
| 68 | 1.848 | 135 |

| TIME | AMPL | PHASE |
|---|---|---|
| 69 | 1.848 | 135 |
| 70 | 1.848 | 45 |
| 71 | 1.848 | 45 |
| 72 | 1.848 | 45 |
| 73 | 1.848 | 45 |
| 74 | 1.848 | 45 |
| 75 | 1.848 | 45 |
| 76 | 1.848 | 45 |
| 77 | 1.848 | 45 |
| 78 | 1.848 | 45 |
| 79 | 1.848 | 45 |
| 80 | 0.765 | -45 |
| 81 | 0.765 | -45 |
| 82 | 0.765 | -45 |
| 83 | 0.765 | -45 |
| 84 | 0.765 | -45 |
| 85 | 0.765 | -45 |
| 86 | 0.765 | -45 |
| 87 | 0.765 | -45 |
| 88 | 0.765 | -45 |
| 89 | 0.765 | -45 |

Fig. 8

METHOD FOR PRESENTING COMPLEX NUMBER WAVEFORMS

BACKGROUND OF THE INVENTION

The present invention relates to the field of signal analysis, and more particularly to the display of complex number waveforms.

Analyzing signals and displaying their characteristics is not new, but new instruments, such as the recently enhanced 3052 Digital Signal Processing System (DSPS) manufactured by Tektronix, Inc., of Beaverton, Oreg., can monitor one or more frequency components of a signal, compiling collections of phase/amplitude data pairs, each collection being a phase/amplitude history of a separate frequency component monitored. Such histories are valuable aids to engineers studying the behavior of complex signals, particularly of communication signals that encode information using phase and amplitude modulation simultaneously. The histories are most valuable, however, if they are displayed graphically in a manner that allows engineers to completely and efficiently decode the information contained in the communication signals under analysis. Also, if the histories are compactly represented, a number of histories can be placed on a single output device—be it a graphics CRT display, a printer or plotter, or any other device capable of displaying graphics—for comparison or for simultaneous inspection.

There are many known techniques for displaying signal characteristics. Some instruments provide a graph of a single variable as a function of time. For example, oscilloscopes provide a time domain view of a signal under analysis, that is, a graph of signal amplitude as a function of time. Although superimposing a graph of phase as a function of time onto an amplitude versus time graph would allow an engineer to completely characterize the phase and amplitude modulation behavior of a signal under analysis, this method would force an engineer to integrate data from two different locations on a display and, furthermore, would not result in the compact representation desired.

Some instruments provide quasi-3-dimensional displays. For example, the spectrum analyzer function of the 3052 DSPS provides a waterfall display. A waterfall display contains a number of planar amplitude versus frequency graphs, the graphs representing the frequency spectra of an input signal at different times. The graphs are stacked closely together, each amplitude versus frequency graph displaced upward and to the right relative to the newer one "in front of" it. Thus, older graphs appear to recede into the display. However, an amplitude/data pair determines a point, not a plane. Since a point lacks size and shape, the displacement of a point will not create the appearance of the point receding into the display.

Therefore, what is desired is a method of simultaneously displaying, in a compact representation, histories of both amplitude and phase for a frequency component of a signal.

SUMMARY OF THE INVENTION

Accordingly, the present invention provides a method of displaying complex waveforms where one of amplitude or phase is graphed versus time and the color (or greyness) of the curve, or the area under the curve, represents the other of amplitude or phase at the time of the first measurement. The coincident display of amplitude and phase allows an engineer to more easily decode the information contained in simultaneously phase and amplitude modulated signals. Due to the compactness of representation, many waveforms may be displayed at once.

The objects, advantages, and novel features of the present invention are apparent from the following detailed description when read in conjunction with the appended claims and the attached drawing.

BRIEF DESCRIPTION OF THE DRAWING

FIG. 2 is a truth table for a Binary Phase Shift Keying (BPSK) modulator.

FIG. 3 is a history of the amplitude and phase of an encoded signal, where the encoder implements the truth table of FIG. 2.

FIG. 4A is a representation of the BPSK data in FIG. 3 according to one embodiment of the present invention.

FIG. 4B is a representation of the BPSK data according to another embodiment of the present invention.

FIG. 8 is a history of the amplitude and phase of the signal of FIG. 6.

DESCRIPTION OF THE PREFERRED EMBODIMENT

Figure 1:
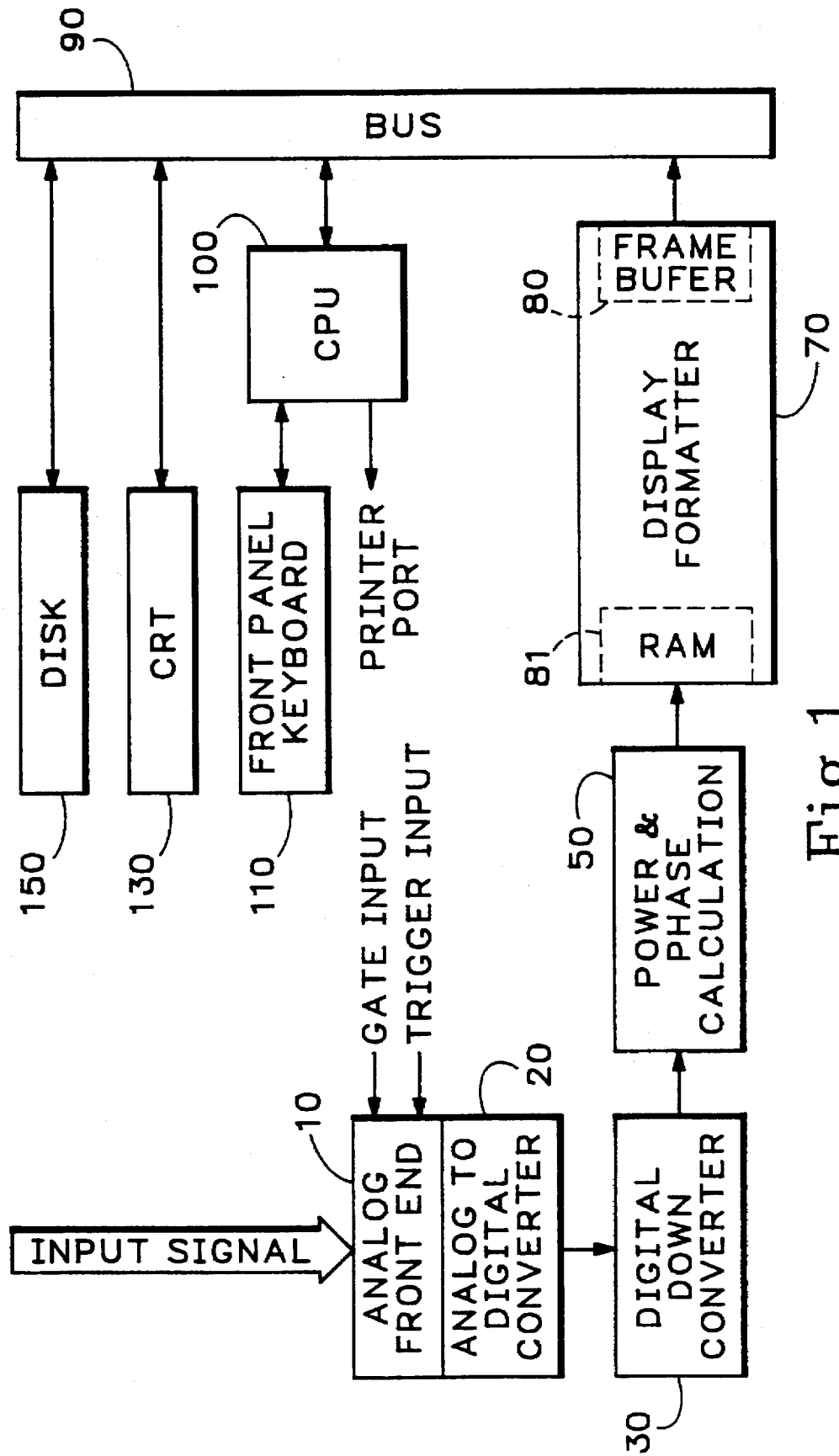
FIG. 1 is a block diagram of an electronic spectrum analyzer embodying the present invention.

FIG. 1 shows a spectrum analysis instrument of a type that may embody the present invention. A time varying electronic signal under analysis is input to an Analog Front End 10. The Analog Front End 10 attenuates and amplifies the signal as required by the input level.

An Analog to Digital Converter 20 samples the conditioned analog input from the Analog Front End 10 and outputs a series of digital words describing the amplitude of the signal as it is sampled. The Analog to Digital Converter typically samples the signal at 25.6 megasamples per second, providing a corresponding useful input signal bandwidth of 10 MHz.

A Digital Down Converter 30 shifts the input bandwidth down by a selectable frequency, typically the expected carrier frequency of the signal of interest, performs a low pass filtering process on the resulting complex signal, and then provides the filtered output, suitably decimated, to a Power and Phase Calculation Circuitry 50.

The Power & Phase Calculation circuitry 50 inputs the filtered data and calculates the signal amplitude and phase angle of each of the complex components. As it completes the amplitude and phase calculations for each signal data point, the Power and Phase Calculation circuitry 50 passes the results to a display formatter 70. For one display interval, the display formatter compiles a list of phase/amplitude result pairs, adding each new pair as it is calculated. A display interval is the amount of time that the display formatter collects phase/amplitude results to represent in one display. Display interval length is programmable. The data formatter translates the list contents into a displayable format and stores a virtual image of a display in a frame buffer 80. The frame buffer contents are provided to a CRT 130; the CRT may be color or pseudo-color (gray-scale) capable. The frame buffer memory locations correspond on a one-to-one basis with the array of pixels on a display 130. The contents of a memory location in the frame buffer dictates the color (or grayness) of the corresponding pixel.

Alternatively, the display formatter 70 may store the amplitude and phase results on a disk 150 for later translation and display.

Finally, a control panel 110, with knobs and a keyboard, is connected to a CPU 100 to provide an operator with general instrument control. For instance, the operator may turn a knob to put the spectrum analyzer into a different display mode or to change the display interval from a default or previously set value.

Having observed how data flows through a spectrum analysis instrument, attention may now be turned to the steps executed within the display formatter 70, according to the present invention, to translate phase and amplitude history data into a displayable format.

According to one possible embodiment, the display formatter stores the phase and history data of a frequency component in working memory 81 such that the amplitude data is addressed as AMPLITUDE_HIST[n] and the phase data is addressed as PHASE_HIST[n]. "n" corresponds to a counter that is zeroed at the beginning of each display interval and is incremented as each phase and amplitude data pair is collected.

In addition to choosing the display interval, the operator may also choose (via the control panel) the minimum and maximum amplitudes to be represented on the display, MIN_AMPLITUDE and MAX_AMPLITUDE, respectively. If the operator does not choose amplitude minimum and maximum display values, the display formatter may by default choose MIN_AMPLITUDE to be the smallest amplitude result of the display interval and MAX_AMPLITUDE to be the largest.

The display formatter calculates the pixel distances from the horizontal reference axis to the pixels that represent real-valued amplitudes, AMPLITUDE_HIST[n]. The distances, PIXEL_DISTANCE[n], may be derived by taking the integer portion of $$\text{MAX\_PIXEL} * \frac{\text{AMPLITUDE\_HIST}[n] - \text{AMPLITUDE\_MIN}}{\text{AMPLITUDE\_MAX} - \text{AMPLITUDE\_MIN}}$$

where MAX_PIXEL is one less than the total number of pixels allotted to represent the range of amplitudes between AMPLITUDE_MIN and AMPLITUDE_MAX.

Similarly, PHASE_HIST[n] may be translated to integers, each representing one of an available palette of colors (or grayness levels). As with amplitude, the operator may choose the minimum and maximum phases that can be displayed, MIN_PHASE and MAX_PHASE, respectively, or the display formatter may choose them automatically. The integer color values, PIXEL_COLOR[n], are calculated by taking the integer parts of $$\text{MAX\_COLOR} * \frac{\text{PHASE\_HIST}[n] - \text{PHASE\_MIN}}{\text{PHASE\_MAX} - \text{PHASE\_MIN}}$$

where MAX_COLOR is one less than the total number of colors allotted to represent the range of phases between PHASE_MIN and PHASE_MAX.

Finally, to build the display, each AMPLITUDE_HIST[n] is encoded as a pixel n pixels to the right of the vertical time reference axis and PIXEL_DISTANCE[n] pixels above the horizontal reference axis, illuminated in the color represented by PIXEL_COLOR[n]. In summary, the shape of the curve represents the time variation of the amplitude of a signal input to the Analog Front End 10 of a spectrum analysis instrument, and the color of the curve represents the time variation of the phase of the input signal. Thus, one curve gives a complete amplitude/phase characterization of the particular frequency component under analysis.

It is instructive to look at several signals and how they may be represented on a display according to the present invention. FIG. 2 shows a truth table for a Binary Phase Shift Keying (BPSK) modulator. BPSK is a scheme for encoding each state of a one-bit input into a separate output phase as discussed, for example, in Alisouskas and Tomasi, "Digital and Data Communications", (Prentice-Hall, 1985), 87–88, which is hereby incorporated by reference. In response to a BPSK modulated signal input to the Analog Front End 10 of a spectrum analysis instrument, the Power/Phase Calculation circuitry 50 may produce the amplitude and phase information shown in FIG. 3.

In this case, the amplitude remains constant throughout the display interval. Assuming AMPLITUDE_MAX and AMPLITUDE_MIN are chosen automatically by the display formatter to be 1.0 Volts and 0.0 Volts, respectively, and MAX_PIXELS is 99, PIXEL_DISTANCE[n] is 99 for all n. Similarly, assuming PHASE_MAX and PHASE_MIN are chosen automatically by the display formatter to be 180.0 degrees and 0.0 degrees, respectively, and MAX_COLOR is 7, PIXEL_COLOR[n] is 7 for all n having PHASE_HIST[n] equal to 180 degrees and 0 for all n having PHASE_HIST[n] equal to 0 degrees. FIG. 4A is a representation of the BPSK amplitude and phase according to the embodiment just described.

If a spectrum analysis instrument has only a pseudo-color CRT, where colors are assigned to greyness variations, a viewer may not be able to discern variations in greyness between points on a CRT. Therefore, when a pseudo-color CRT is used, the display formatter 70 may illuminate a line of pixels from the horizontal reference axis in the greyness level represented by PIXEL_COLOR[n]. FIG. 4B shows the amplitude and phase history of FIG. 3 in a pseudo-color embodiment. This embodiment would also be useful when the output device is a grey-scale printer.

Figures 5A, 5B:
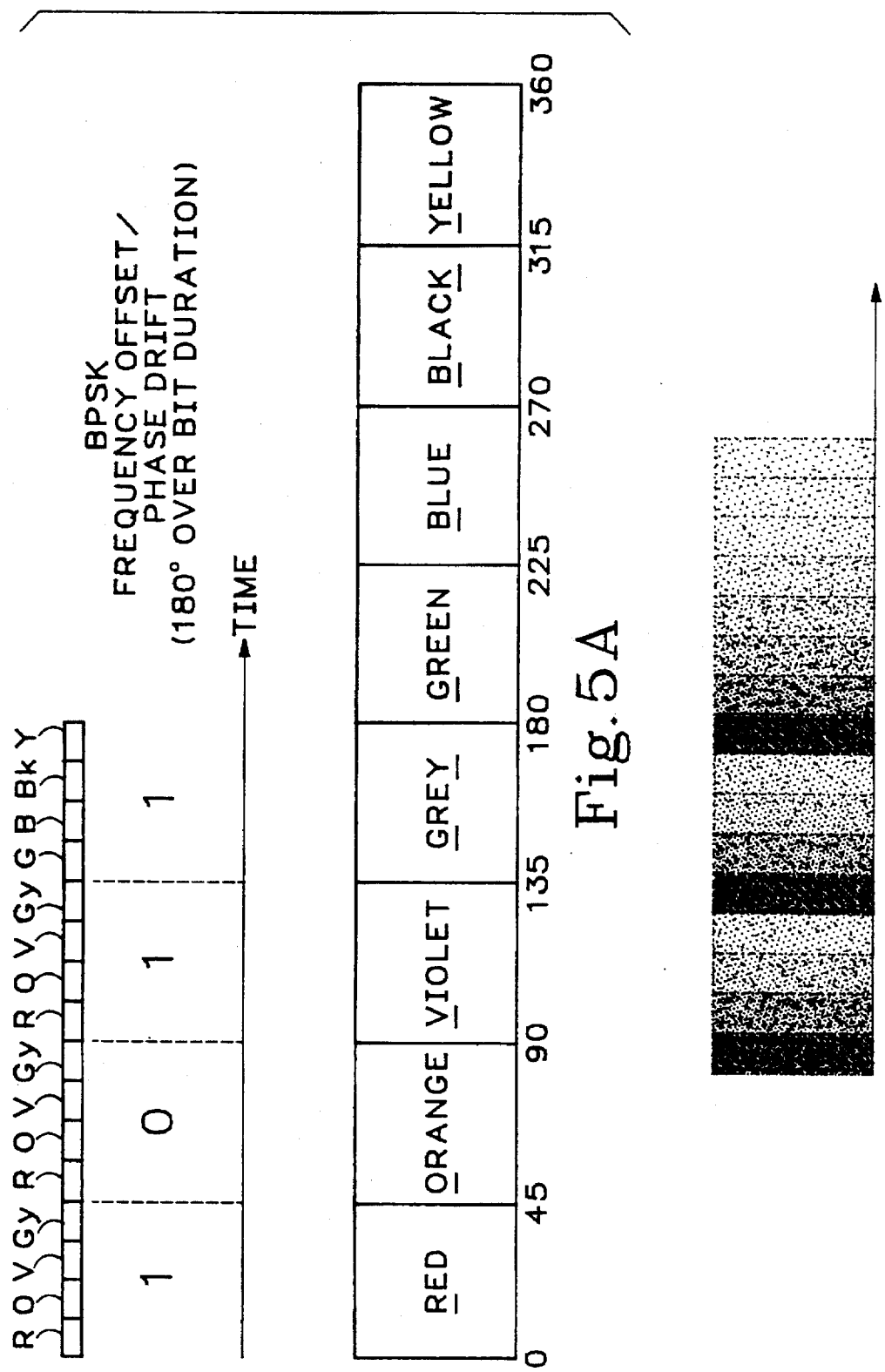
FIG. 5A is a representation of a BPSK encoded signal, where the encoding suffers from phase drift, according to one embodiment of the present invention.
FIG. 5B is a representation of the phase-drifted BPSK encoded signal according to another embodiment of the present invention.

FIG. 5A shows a color display of a BPSK signal that was intended to be similar to the signal of FIG. 3, but that suffers from phase drift. FIG. 5B shows the same BPSK signal in the pseudo-color embodiment.

Figures 6, 7:
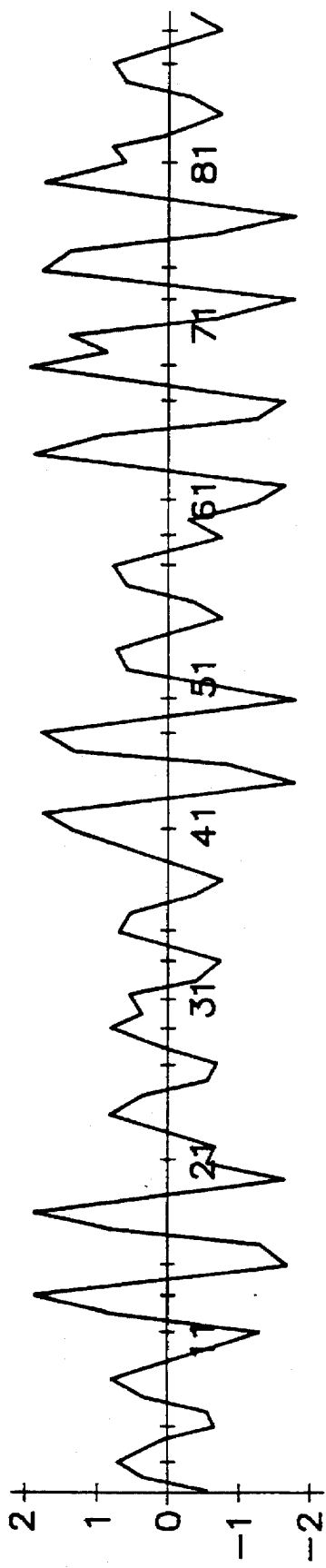
FIG. 6 is a time domain view of an 8QAM amplitude and phase modulated signal.
FIG. 7 is a truth table for the 8QAM modulator used to encode the signal of FIG. 6.

Referring now to FIG. 6, a time domain view of an 8QAM phase and amplitude modulated signal of constant frequency is shown. 8QAM is a scheme for encoding each of 8 tri-bit input combinations into a separate output phase/amplitude combination as discussed in Tomasi, "Electronic Communications Systems: Fundamentals through Advanced" (Prentice-Hall, 1988), 520, which is hereby incorporated by reference. The truth table shown in FIG. 7 is for the 8QAM modulator used to derive the encoded signal of FIG. 6. In response to the signal of FIG. 6, the Power/Phase Calculation circuitry 50 produces the amplitude and phase information shown in FIG. 8 in the manner detailed above.

Figure 9A:
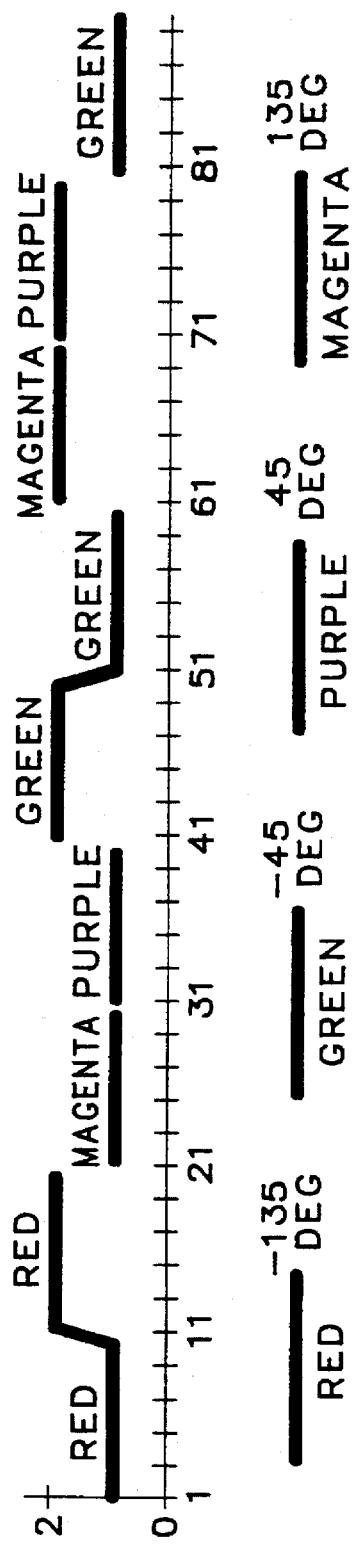
FIG. 9A is a representation of the data in FIG. 8 according to one embodiment of the present invention.
Figure 9B:
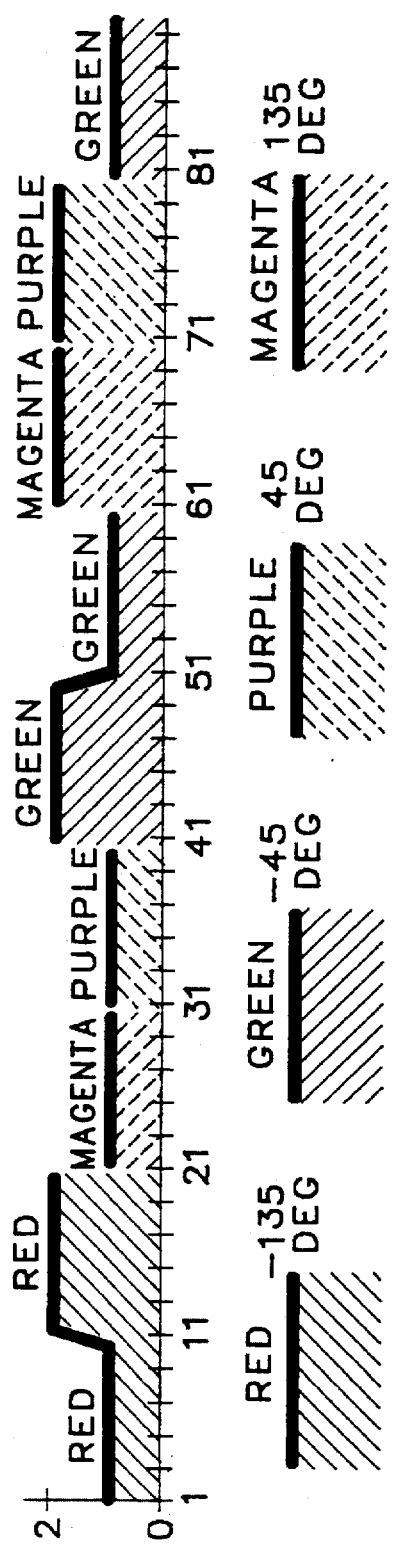
FIG. 9B is a representation of the data in FIG. 8 according to another embodiment of the present invention.

FIG. 9A is a representation of the data in FIG. 6 according to the color embodiment of the amplitude-phase display of the present invention. FIG. 9B is a representation of the data in FIG. 8 according to the pseudo-color embodiment of the amplitude-phase display of the present invention. If an input signal is comprised of a plurality of frequency components, displays according to the present invention may represent the time variation of phase and amplitude of one particular frequency component of the multi-frequency input signal.

While several embodiments of the present invention have been described, it will be apparent to those skilled in the art that many changes and modifications may be made without departing from the invention in its broader aspects. As just one example, in the described embodiments time is represented as a linear distance from a time reference; time may also be represented as an angular distance from a time reference. The claims that follow are therefore intended to cover all such changes and modifications as fall within the true spirit and scope of the invention.

What is claimed is:

1. A method of processing a collection of amplitude/phase data pairs, each pair representing the amplitude and phase of a single frequency component of an input signal during a separate sampling interval, comprising the steps of:

formatting each data pair for display such that one of amplitude and phase is represented by a distance from a reference and the other of amplitude and phase is represented by an intensity data value; and displaying the formatted data.

2. The method of claim 1 wherein the formatting step, for each data pair, comprises the steps of:

determining a row in a frame buffer to represent the amplitude;

determining a column in the frame buffer to represent the sampling interval;

determining an intensity value to represent the phase; and storing the intensity value at the location in memory addressed by the row and column.

3. The method of claim 2 wherein the formatting step further comprises the step of storing the intensity value for all column locations below the addressed row.

4. The method of claim 2 wherein the intensity data value represents a displayable color.

5. The method of claim 2 wherein the intensity data value represents a displayable grey tone.

6. The method of claim 2 wherein the intensity data value represents a displayable color and intensity.

7. The method of claim 1 wherein the formatting step, for each data pair, comprises the steps of:

determining a row in a frame buffer to represent the phase;

determining a column in the frame buffer to represent the sampling interval;

determining an intensity value to represent the amplitude; and storing the intensity value at the location in memory addressed by the row and column.

8. The method of claim 7 wherein the formatting step further comprises the step of storing the intensity value at all locations of the column address below the row address.

9. The method of claim 7 wherein the intensity data value represents a displayable color.

10. The method of claim 7 wherein the intensity data value represents a displayable grey tone.

11. The method of claim 7 wherein the intensity data value represents a displayable color and intensity.

* * * * *